United States Patent [19]

Van Hijfte et al.

[11] 4,144,533

[45] Mar. 13, 1979

[54] AUTOMATIC GAIN CONTROL CIRCUIT FOR A PULSED RADAR

[75] Inventors: Herman M. Van Hijfte, Hengelo; Jan Bergman, Haaksbergen, both of Netherlands

[73] Assignee: Hollandse Signaalapparaten B.V., Hengelo, Netherlands

[21] Appl. No.: 829,621

[22] Filed: Sep. 1, 1977

[30] Foreign Application Priority Data

Sep. 6, 1976 [NL] Netherlands .................... 7609865

[51] Int. Cl.² ............................................. G01S 7/34
[52] U.S. Cl. ................................................ 343/7 AG
[58] Field of Search .................. 343/7 AG, 5 VQ, 7.7

[56] References Cited

U.S. PATENT DOCUMENTS

| 2,711,531 | 6/1955 | Murdock | 343/7 AG |
|---|---|---|---|
| 3,845,481 | 10/1974 | Danzer et al. | 343/7 AG |
| 4,042,922 | 8/1977 | Natter et al. | 343/7 AG |

Primary Examiner—Maynard R. Wilbur
Assistant Examiner—Lawrence Goodwin
Attorney, Agent, or Firm—David R. Treacy; Algy Tamoshunas

[57] ABSTRACT

Disclosed is an automatic gain control (AGC) circuit for an IF amplifier utilized in the receiver of a pulsed radar. The AGC circuit is provided with a noise measuring circuit for determining the minimum value of a number of average noise levels over corresponding time intervals of given short duration within the length of time for the range-independent RF signal amplification in the pulse repetition period. Such a noise level, based on the minimum value, can be considered to be least influenced by rain clutter. The IF amplifier is adjusted to this noise level.

9 Claims, 1 Drawing Figure

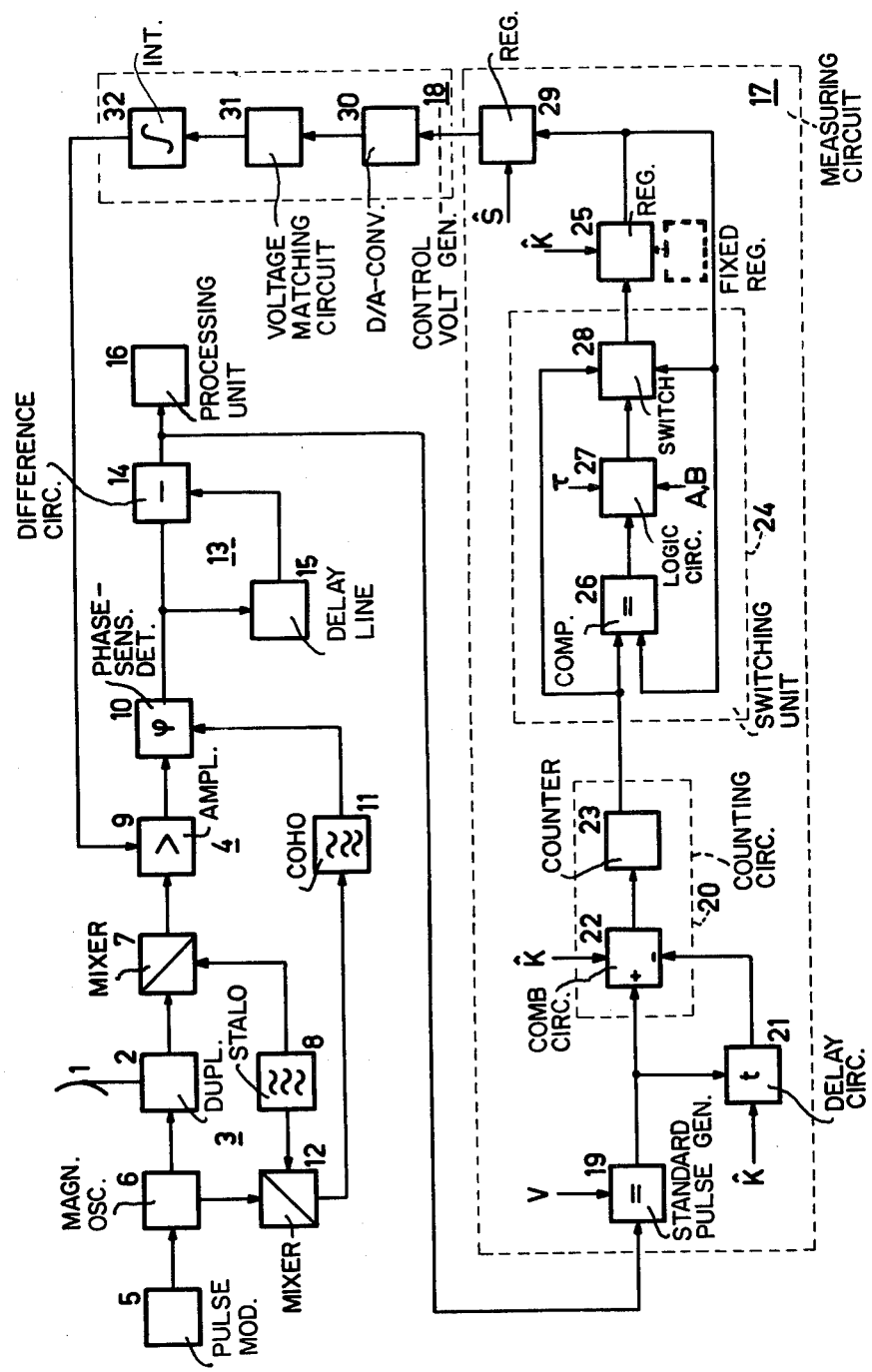

AUTOMATIC GAIN CONTROL CIRCUIT FOR A PULSED RADAR

The invention relates to an automatic gain control (AGC) circuit for an IF amplifier utilized in the receiver of a pulsed radar.

A pulsed radar provided with such an AGC circuit is well known and makes it possible to maintain the average noise level at a constant value in order to prevent saturation of the receiver by strong signals as much as possible. For a short period at the end of the listening time during the pulse repetition period, the average voltage level of the noise then present is measured. The measured value is considered to represent the average noise level in such a pulse repetition period and is utilised in setting the gain factor of the IF amplifier in the following pulse repetition period.

If, however the above-mentioned short period coincides with a period of reception of rain clutter returns, a high noise level will be measured and the AGC circuit will set the gain factor of the IF amplifier to a lower value. As a result, the detection of target returns from an azimuth sector will be impaired.

A solution to this problem could be found in the application of a fast acting AGC circuit, whereby the gain factor of the IF amplifier with a transition from a region of rain activity to a region devoid of such activity adapts itself rapidly to the new situation.

Such a fast acting AGC circuit would however have the disadvantage that one single strong target return signal or strong noise peak could result in a significant change of the gain factor of the IF amplifier and this would again impair the detection of target returns. It is therefore an object of this invention to provide an automatic gain control circuit of the type set forth in the opening paragraph, eliminating the above problem with respect to the detection of target returns from the direct environment of a region of rain activity.

The AGC circuit according to the invention is provided with a noise measuring circuit for determining the minimum value of a number of average noise levels over corresponding time intervals of given duration within the length of time for the range-independent RF signal amplification in the pulse repetition period, and with a control voltage generator for generating a control voltage to be derived from this minimum value and applied to the IF amplifier.

By determining the above minimum value it is made certain that this value is obtained only from noise signals which do not contain rain clutter components. From this minimum value a control voltage for the IF amplifier is obtained from this minimum value.

The invention will now be further explained with reference to the accompanying FIGURE, illustrating an embodiment of a pulsed radar provided with an AGC circuit according to the invention.

As shown in the FIGURE, the radar includes an antenna 1 connected to a transmitter 3 and a receiver 4 via a duplexer 2. The transmitter 3 produced RF pulses and is provided with a magnetron oscillator 6 driven by a pulse modulator 5.

The embodiment of a pulsed radar according to the invention is designed for the coherent detection of return signals obtained through the RF pulses. It should however be noted that the invention is not exclusively confined to pulsed radar systems designed for the coherent detection of return signals, but can also be applied in pulsed radars using a different method for the detection of return signals.

The receiver 4 of the embodiment in question comprises a mixer 7 connected to the duplexer 2. The received RF return signal is mixed in mixer 7 with the output signal of a stable local oscillator (STALO) 8. The IF output signal of mixer 7 thus obtained is — after amplification by IF amplifier 9 — applied to a phase-sensitive detector 10. Detector 10 is also fed with the output signal of a coherent oscillator (COHO) 11.

The coherent detection of video signals however requires the output signal of the COHO 11 to be in phase with the IF return signal which has not been subject to a frequency change through a doppler shift. In the embodiment in question, the COHO 11 is therefore phase-controlled by the output signal of a second mixer 12, producing the difference signal of the signals applied by the STALO 8 and the magnetron oscillator 6. A modified design of a coherent detection system in a transmitter/receiver, employing a klystron, is described on page 117 of "Introduction to Radar Systems," M. J. Skolnik, McGrawHill Book Company Inc., (1962).

The magnitude of the output signal (video signal) of detector 10 is proportional to the phase difference between the two applied input signals. Consequently, the video signals of detector 10 from fixed objects always retain the same magnitude and the video signals of detector 10 from moving objects will vary in magnitude from pulse to pulse.

A clutter suppressor 13 connected to detector 10 makes it possible to eliminate the video signals from fixed targets or from slowly moving targets. In the embodiment in question, the clutter suppressor 13 comprises a difference circuit 14, which is fed with the video signals of detector 10 both directly and via a delay line 15, imparting a delay of one pulse repetition period. From the two simultaneously applied video signals, the difference circuit 14 derives a difference signal which is applied to a unit 16 for the processing of video signals. Since the unit 16 has a threshold for its input voltage, the return signals from fixed objects, as well as those of slowly moving objects, are suppressed. Instead of a single clutter suppressor, a multiple design may also be employed.

In order to make the gain factor of the IF amplifier 9 dependent only on noise devoid of rain clutter components, the pulsed radar is provided with an automatic gain control circuit for generating a control voltage for this amplifier. The amplitude of the control voltage is determined by the minimum value of a number of average noise levels measured over corresponding time intervals of fixed duration within the length of time for the range-independent RF signal amplification in the preceding pulse repetition period. The AGC circuit is provided with a noise measuring circuit 17 and a control voltage generator 18. The noise measuring circuit 17 is used for the determination of the above-mentioned minimum value, while the control voltage generator 18 produces, from this minimum value, a suitable control voltage for the IF amplifier. From the minimum value obtained through circuit 17, it may be expected that this value is indeed derived from noise devoid of rain clutter components.

To obtain such a minimum value the noise measuring circuit 17 is provided with a standard pulse generator 19, which is fed with the output signal of the clutter suppressor 13. In the absence of the clutter suppressor 13, the output signal of receiver 4 is applied to generator 19. The standard pulse generator 19 also receives a fixed reference voltage V, with which the output signals of the clutter suppressor 13 are compared. Input signals weaker than this reference voltage are eliminated, while input signals stronger than the reference result in a standard pulse at the output of the standard pulse generator 19.

The noise measuring circuit 17 is also provided with a counting circuit 20, receiving the standard pulses of generator 19 both directly and via a delay circuit 21, which is fed with clock pulses $\hat{K}$ of a clock pulse generator not shown in the figure. The counting circuit 20 is designed so that the directly applied standard pulses result in an increase of the count value of the counting circuit and the applied delayed standard pulses in a decrease thereof. The delay time t introduced by circuit 21, which delay also determines the length of the time intervals in which the average noise level is measured, is small in comparison with the pulse repetition period.

A suitable embodiment of a counting circuit 20 is formed by a combination circuit 22 and a counter 23. The combination circuit 22 controlled by clock pulses $\hat{K}$, is capable of delivering a maximum of one count pulse in each time interval determined by two consecutive clock pulses. If in a time interval only one standard pulse is applied directly to the combination circuit 22, this circuit generates an adding pulse, but if only a delayed standard pulse is applied via the delay circuit 21, circuit 22 produces a subtracting pulse. The combination circuit 22 produces no output signal if in such a time interval no standard pulse is received at all, or if a direct and a delayed standard pulse are received simultaneously. The counter 23 is provided for processing of the adding and subtracting pulses. In an applied embodiment, the combination circuit 22 is provided with separate outputs for the generated adding and subtracting pulses, while the counter 23 comprises two inputs for the separate processing of these pulses.

In a switching unit 24 the count value of the counting circuit 20 is continuously compared with a count value stored in a first register 25. Only when the switching unit 24 receives from circuit 20 a count value smaller than that of register 25, the count value in this register is replaced by that of circuit 20 except in certain cases discussed hereinafter. If the count value of circuit 20 is larger than that of register 25, the count value of the latter remains unchanged. Changing of the count value in register 25 occurs in the generating rhythm of the clock pulses $\hat{K}$.

In the embodiment in question the switching unit 24 contains a comparator 26, a logic circuit 27 and a switch 28. The comparator 26, receiving the count values from counting circuit 20 and register 25, ensures that, except in certain cases discussed hereinafter, the smaller of the two applied count values is written into the register 25 via the logic circuit 27 and the switch 28. It will be obvious that a change in the count value stored in register 25 will occur in the pulse rhythm of the clock pulses $\hat{K}$.

The value in register 25 at the start of each noise measuring procedure in a pulse repetition period should be sufficiently large to assure that during the measuring procedure the count value is representative of the minimum value of a number of average noise levels in corresponding time intervals of t seconds for the part of the pulse repetition period already elapsed at that instant. The cases referred to above, where the comparator 26 does not permit the writing of the smaller of the count values of the first register 25 and the counting circuit 20 into this register, are those occurring in determining the minimum value of the noise level in the starting phase of each pulse repetition period, as in this phase return signals from nearby objects are received. Since these objects reflect very strongly, relatively strong return signals are received in comparison with return signals from more distant objects. Due to this fact, many pulsed radar systems incorporate a range-sensitive detection control for return signals. This control, known as sensitivity time control (S.T.C.), implies that the gain of a radar receiver increases as the target range increased. This gain must however be limited to a maximum value, as otherwise noise signals received at a later stage in a pulse repetition period, would in turn be excessively amplified.

On the other hand, such an S.T.C. control causes noise signals received in the starting phase of a pulse repetition period, as a result of the low gain then prevailing, to become so weak as to be conducive to the production of a standard pulse by the pulse generator 19. The result is that, taking into account the actual noise level at the start of a pulse repetition period, a relatively small count value will be built up in the counting circuit 20. Hence, the count value stored in register 25 would be too small and would not represent a measured minimum value of the average noise level in the absence of S.T.C. control. Therefore, with a pulsed radar containing S.T.C. control it is necessary to defer the control of switch 28 by the comparator 26, at any rate in the phase when the output of the delay circuit 21 is subject to S.T.C. control. The time duration $\tau$ of this phase is therefore equal to the time required for the S.T.C. control increased by the delay time t. The logic circuit 27 between circuit 26 and switch 28 accounts for the deferment of the control switch 28 by comparator 26.

The design of the logic circuit 27 depends on the way in which the register 25 is loaded with the indicated and sufficiently large count value in the starting phase of each pulse repetition period. In a first embodiment of a switching unit 24 the generated standard pulses — delayed or undelayed — are processed in the counting circuit 20 each pulse repetition period for the time $\tau$, while the instantaneous count values of this counting circuit are written into the register 25 each clock pulse interval $\hat{K}$. During this process the switch 28 is not under the control of the comparator 26. After time $\tau$ the control of switch 28 by the comparator 26 is resumed. To be able to meet the above conditions, the logic circuit 27 is so designed that during time $\tau$ and during the time intervals outside the time $\tau$ as determined by the clock pulses, in which time intervals the count value of the counting circuit 20 is smaller than the value stored in register 25, the circuit 27 brings or keeps the circuit 28 in the state that the former count value can be applied for writing into the register 25. If this is not so, the circuit 27 brings or holds the switch 28 in the state that the stored value of register 25 is reapplied to this register. In the embodiment in question the logic circuit 27 functions in accordance with the Boolean transfer function $f(\tau,C)=\tau+C$, where $\tau$ is the signal which is generated by the timing unit and which is digitally true only during time interval $\tau$, C is the signal which is generated by the comparator 26 and which is digitally true when the count value of counting circuit 20 is smaller than that stored in register 25, and $f(\tau,C)$ is the signal applied to switch 28. When f(τ,C) is digitally true, the count value of counting circuit 20 is applied to register 25 via switch 28; in the other case, the count value stored in register 25 is reapplied to this register via switch 28.

In a second embodiment of a switching unit 24 a fixed, but sufficiently large digital value stored in a register is written into register 25 at the start of each pulse repetition period, while in the time interval τ the switch 28 is not under the control of the comparator 26. In the embodiment in question the logic circuit 27 functions in accordance with the truth function $f(\tau,C) = \overline{\tau}.C$.

In the two embodiments of unit 24 it is achieved that register 25 contains a sufficiently large count value at the start of a measuring procedure in each pulse repetition period. During this procedure the count value is decreased to the value which is representative of the minimum value of the noise level in that pulse repetition period excluding the time in which the S.T.C. control is active.

Using the control voltage generator 18, the gain factor of amplifier 9 is determined from the count value stored in register 25 at the end of a pulse repetition period. In the embodiment in question, the control voltage generator consists of a digital-to-analogue converter 30, a voltage matching or correction circuit 31, and an integrator 32, all connected in series. A synchronisation pulse S is used to write the value of register 25 into the second register 29, while the digital-to-analogue converter 30 delivers an analogue voltage related to the digital value of register 29. From this analogue voltage the voltage matching circuit 31 produces a suitable control voltage for an integrator 32. The output voltage of integrator 32, which is negative in the embodiment in question, is applied to the IF amplifier 9 for setting the gain factor of this amplifier.

As stated earlier, it is possible to design the pulsed radar described above without the incorporation of a coherent detector and/or clutter suppressor. In such a construction, the receiver delivers linearly detected video signals which — when of sufficient intensity and directly applied to a standard pulse generator — result in standard pulses. The standard pulses are used to activate the AGC circuit in the same manner as described earlier.

The AGC circuit can also be used in a search radar of the track-while-scan type. In an embodiment of such a radar provided with the above AGC circuit no noise measurements are performed during the linear detection of return signals from a polar tracking window defined in azimuth and range. In the period A when the counting circuit 20 is able to receive video signals from the polar tracking window, the logic circuit 27 ensures that only the count value of register 25 is reapplied via switch 28 for writing into this register. If the polar tracking window is situated between the ranges R and R+r with respect to the radar location, the period A is determined by the time interval (2R/C, (2R+2R/C)+t) starting from the instant of transmission of a transmitter pulse. During this period, when the noise measurement is performed, no video signals from the polar track window can be applied to the switching unit 24, neither directly nor via the delay line 21. If B represents the period of an antenna revolution, during which a polar tracking window is to be produced, the first embodiment should comprise a logic circuit 27 with the transfer function $f(\tau,A,B,C) = \tau + \overline{A}.\overline{B}.C$ instead of $f(\tau,C) = \tau + C$. In the second embodiment the transfer function should then be $f(\tau,A,B,C) = \overline{\tau}.\overline{A}.\overline{B}.C$ instead of $f(\tau,C) = \overline{\tau}.C$. In these expressions A and B represent the signals to be generated by a timing unit, which signals are digitally true during the respective periods. If f(τ,A,B,C) is digitally true, the count value of the counting circuit 20 is applied for writing into register 25 via switch 28.

What we claim is:

1. An automatic gain control circuit for an IF amplifier used in a pulsed radar receiver, said automatic gain control circuit comprising a noise measuring circuit for determining the minimum value of a number of average noise levels over corresponding time intervals of given duration within the length of time for the range-independent RF signal amplification in the pulse repetition period, said noise measuring circuit including a counting circuit for counting direct-supplied video pulses which exceed a fixed value and replicas of said video pulses supplied through a delay line to generate a count value corresponding to the number of supplied direct pulses decreased by the number of supplied replica pulses, a first register for storing a count value, a switching unit coupled to said counting circuit and said first register, said switching unit being operative, upon application of both the count value of the counting circuit and the count value stored in the first register, to pass the smaller of the two count values for writing into the first register at the end of a time interval $\hat{K}$ to be fixed by two consecutive clock pulses within a period lying in said length of time and a second register connected to the first register for storing at the end of each pulse repetition period the count value stored in the first register as said minimum value, and a voltage generator for generating an IF amplifier control voltage derived from said minimum value.

2. An automatic gain control circuit as claimed in claim 1, wherein said counting circuit comprises a counter and a combination circuit for supplying to said counter during each time interval $\hat{K}$, an adding pulse upon receiving within such a time interval only a direct supplied video pulse, and a substracting pulse on receiving only a replica of a video pulse.

3. An automatic gain control circuit as claimed in claim 1, wherein the noise measuring circuit comprises a pulse generator connected to said delay line and said counting circuit for generating a standard video pulse on the reception of a video pulse exceeding said fixed value.

4. An automatic gain control circuit as claimed in claim 1, wherein the switching unit comprises a switch connected to the counting circuit and the first register, and means for comparing the count value stored in said first register and the count value of said counting circuit and generating a control signal for said switch during each time interval $\hat{K}$ within a period lying in said length of time, which control signal is used to supply the first register with the smaller of the two count values fed to said switch.

5. An automatic gain control circuit as claimed in claim 4, wherein said comparing means includes a comparator and a logic circuit connected to the comparator in order to obtain said control signal fed to said switch, said logic circuit operating in accordance with the Boolean transfer function $f(\tau,C) = \tau + C$, where τ represents the signal derived from a timing unit, which signal is digitally true only during an initial period of the pulse repetition period, said initial period expiring in said length of time, C is the comparator-supplied control signal which is digitally true when the count value of the counting circuit is the smaller of the two count values and digitally false when the count value of the first register is the smaller of the two count values, and $f(\tau,C)$ is the signal which is supplied to the switch with the effect that, when $f(\tau,C)$ is digitally true, the count value of the counting circuit is applied to the first register via the switch, and when digitally false the count value of the first register is reapplied to the first register.

6. An automatic gain control circuit as claimed in claim 4, wherein at the start of each pulse repetition period a digital number representing a high noise level is written from a fixed register to the first register, and wherein said comparing means comprises a logic circuit connected to the comparator for generating said control signal, said logic circuit operating in accordance with the Boolean transfer function $f(\tau,C)=\bar{\tau}\cdot C$, where $\tau$]is the signal derived from a timing unit, which signal is digitally true only during an initial period of the pulse repetition period, said initial period expiring in said length of time, C is the comparator-supplied control signal which is digitally true when the count value of the counting circuit is the smaller of the two count values and digitally false when the count value of the first register is the smaller of the two count values, and $f(\tau,C)$ is the signal which is supplied to the switch with the effect that, when $F(\tau,C)$ is digitally true, the count value of the counting circuit is applied to the first register via the switch, and when digitally false the count value of the first register is reapplied to the first register.

7. An automatic gain control circuit as claimed in claim 6, wherein said initial period is equal to the sum of the delay time of the delay line and the period of time of the range-dependent RF voltage gain within that pulse repetition period.

8. An automatic gain control circuit as claimed in claim 5, wherein the logic circuit is active in accordance with the Boolean transfer function $f(\tau,A,B,C)=\tau+\overline{A.B.C}$, where signal B derived from the timing unit is digitally true inside an azimuth sector and digitally false outside the azimuth sector, which azimuth sector will contain a generated polar tracking window, signal A derived from the timing unit is digitally true only during said length of time, in which time the counting circuit is capable of processing both delayed and undelayed video signals out of said tracking window, and $f(\tau,A,B,C)$ is the signal which is supplied to the switch with the effect that, when $f(\tau,A,B,C)$ is digitally true, the count value of the counting circuit is applied to the first register via the switch, and when digitally false, the count value of the first register is reapplied to the first register.

9. An automatic gain control circuit as claimed in claim 6, wherein the logic circuit is active in accordance with the Boolean transfer function $f(\tau,A,B,C)=\overline{\tau.A.B.C.}$, where signal B derived from the timing unit is digitally true inside an azimuth sector and digitally false outside the azimuth sector which azimuth sector will contain a generated polar tracking window, signal A derived from the timing unit is digitally true only during said length of time, in which time the counting circuit is capable of processing both delayed and undelayed video signals out of said tracking window, and $f(\tau,A,B,C)$ is the signal which is supplied to the switch with the effect that, when $f(\tau,A,B,C)$ is digitally true, the count value of the counting circuit is applied to the first register via the switch, and when digitally false the count value of the first register is reapplied to the first register.

* * * * *

UNITED STATES PATENT AND TRADEMARK OFFICE
CERTIFICATE OF CORRECTION

PATENT NO. : 4,144,533
DATED : March 13, 1979
INVENTOR(S) : HERMAN M. VAN HIJFTE ET AL It is certified that error appears in the above-identified patent and that said Letters Patent are hereby corrected as shown below:

Col. 7,
Claim 6, line 16, after "T" delete "]"

Signed and Sealed this

Fifth Day of February 1980

[SEAL]

Attest:

SIDNEY A. DIAMOND

Attesting Officer    Commissioner of Patents and Trademarks